United States Patent [19]

Werner et al.

[11] Patent Number: 5,387,438
[45] Date of Patent: Feb. 7, 1995

[54] METHOD FOR THE SELECTIVE DEPOSITION OF TUNGSTEN ON A SILICON SURFACE

[75] Inventors: Christoph Werner, Krailling, Germany; Ignacio Ulacia, Guadalajara, Mexico

[73] Assignee: Siemens Aktiengesellschaft, Munich, Germany

[21] Appl. No.: 73,622

[22] Filed: Jun. 3, 1993

Related U.S. Application Data

[63] Continuation of Ser. No. 795,177, Nov. 18, 1991, abandoned.

[30] Foreign Application Priority Data

Dec. 6, 1990 [DE] Germany .......................... 4038990

[51] Int. Cl.⁶ ...................... C23C 16/04; C23C 16/08
[52] U.S. Cl. .................................. 427/253; 427/255; 427/255.1
[58] Field of Search ................... 427/248.1, 250, 253, 427/255, 255.1, 259

[56] References Cited

U.S. PATENT DOCUMENTS

| | | | |
|---|---|---|---|
| 4,503,601 | 3/1985 | Chiao | 29/571 |
| 4,562,638 | 1/1986 | Schwabe et al. | 29/577 |
| 4,595,608 | 6/1986 | King et al. | 427/237 |
| 4,617,087 | 10/1986 | Iyer et al. | 156/643 |
| 4,746,549 | 5/1988 | Ito et al. | 427/253 |
| 4,794,019 | 12/1988 | Miller | 427/124 |
| 5,037,775 | 8/1991 | Reisman | 437/89 |

OTHER PUBLICATIONS

Applied Surface Science, Bd 38 Apr. 10, 1989 "Flow and Reaction Simulation of a Tungsten CVD Reactor" Ulacia et al pp. 370–385.

Singh et al. Slim: Simulation of Laser Interactions with Materials, University of Florida.

Tungsten & Other Advanced Metals for VLSI/ULSI Applications V, Materials Research Society, Pitts., Pa., Bd. 5, "An Experimental & Modeling Study of the Tungsten LPCVD Growth Kinetics from H2–WF6 at Low WF6 Partial Pressures", by C. R. Kleijn et al, Oct. 19, 1989, pp. 109–116.

Applied Surface Science, Bd. 38, Amsterdam, NL, Apr. 10, 1989, "Flow & Reaction Simulation of a Tungsten CVD Reactor", by J. I. Ulacia et al, pp. 370–385.

"Kinetics & Mechanism of Selective Tungsten Deposition by LPCVD" by Pauleau et al, J. Electrochem. Soc., Solid–State Science & Technology Nov., 1985, pp. 2779–2784.

"Flow & Reaction Simulation of a Tungsten CVD Reactor", by Ulacia et al, Appl. Surface Science, 38, 1989, pp. 370–385.

"The Kinetics of LPCVD Tungsten Deposition in a Single Wafer Reactor" by McConica et al, Journal of the Electrochemical Society 133, Dec. 1986, pp. 2542–2548.

*Primary Examiner*—Shrive Beck
*Assistant Examiner*—Bret Chen
*Attorney, Agent, or Firm*—Hill, Steadman & Simpson

[57] ABSTRACT

Method for the selective deposition of tungsten on a silicon surface. A silicon surface is provided with a masking structure of, for example, $SiO_2$. The deposition from the vapor phase is implemented in a CVD reactor from a mixture of process gases such that the masking structure remains essentially free of tungsten. The process parameters of temperature, pressure and flow-through rates of the process gases for the selective deposition are determined for a prescribed deposition rate by solving an equation system that contains the conservation laws for the mass, the chemical constituents participating in the deposition reaction, the momentum and the energy taking the boundary conditions of the CVD reactor into consideration, and the effects of thermodiffusion and multi-constituent diffusion.

3 Claims, No Drawings

METHOD FOR THE SELECTIVE DEPOSITION OF TUNGSTEN ON A SILICON SURFACE

This is a continuation, of application Ser. No. 07/795,177, filed Nov. 18, 1991, now abandoned.

BACKGROUND OF THE INVENTION

The selective deposition of tungsten on silicon is used in the technology of integrated circuits for, for example, filling up via holes. Tungsten is thereby designationally deposited onto silicon surfaces that have been etched free. Structures of silicon oxide that surround the silicon surface should remain free of the deposition.

The problem arises in the selective deposition of tungsten that, in addition to the desired tungsten deposition on the silicon surface, a few undesired tungsten nuclei also grow on the masking structures of silicon oxide. The reason for this is the production of intermediary reaction products that arise in a low concentration during tungsten deposition onto silicon. Due to their high reactivity, these intermediary reaction products lead to the deposition of tungsten on $SiO_2$, as well as, on the silicon surface.

It is known from C. M. McConica et al., Journal of the Electrochemical Society 133, pages 2542 through 2548 (1986) to avoid the deposition of tungsten nuclei on $SiO_2$ surfaces in that the temperature or the pressure are reduced during the deposition. The production rate of the undesired reaction products and, thus, the number of tungsten nuclei on the masking structures of $SiO_2$ are thus reduced. At the same time, however, the deposition rate of tungsten onto the silicon surface is also reduced. Significantly longer process times must therefore be accepted.

The process parameters of pressure, temperature as well as through-flow rates of the process gases, over and above this, are dependent on the specific geometry of the reactor wherein the deposition is undertaken from the vapor phase. These process parameters must be optimized on the basis of tedious trials such that the selectivity of the tungsten deposition is adequate and that, at the same time, the tungsten deposition rate on the silicon surface is not too low.

SUMMARY OF THE INVENTION

It is an object of the present invention to provide a method for the selective deposition of tungsten on a silicon surface wherein a time-saving and cost-saving optimization of the process parameters is utilized.

This object is inventively achieved by a method having the following steps: providing the silicon surface with a masking structure; implementing deposition of tungsten from a vapor phase in a CVD reactor from a mixture of process gases such that the masking structure remains essentially free of tungsten; and calculating process parameters of temperature, pressure and flow-through rates of the process gases for the selective deposition for a prescribed deposition rate using an equation system that contains conservation laws for mass, chemical constituents participating in the deposition reaction, momentum and energy taking boundary conditions of the CVD reactor into consideration and effects of thermodiffusion and multi-constituent diffusion.

The equation system recited above, in particular, is numerically solved by a computer. The trials are thus replaced by a simulation program. An optimization of the deposition rate that is faster and more cost-beneficial than one based on a long series of trials is thus possible.

It is especially advantageous to base the solution of the equation system on a coordinate system that is adapted to the symmetry of a chemical vapor deposition (CVD) reactor. The influence of geometrical variations of the CVD reactor on the process parameters can thereby be quickly calculated.

The present invention can be particularly employed when the masking structure is composed of $SiO_2$. However, it likewise lies within the scope of the present invention that the masking structure can be composed of other materials, for example $Si_3N_4$.

The materials $H_2$ and $WF_6$, for example, are supplied as process gases. The reaction products $WF_x$ and $SiF_x$ promote the formation of nuclei on the masking structure and therefore lead to a decrease in the selectivity of the deposition.

DESCRIPTION OF THE PREFERRED EMBODIMENT

An investigation of the gas flow and the reactions in a tungsten CVD reactor is known from I. Ulacia et al., Appl. Surface Science, 38, pages 370 through 385 (1989). The effect of thermodiffusion and of multi-component diffusion was thereby left out of consideration. This effect, however, is of critical significance for the selective deposition of tungsten on a silicon surface.

The tungsten deposition occurs, for example, in a cylindrical CVD reactor. The mixture of the process gases is admitted into the CVD reactor at the floor of the CVD reactor. The silicon surface is arranged perpendicular to the gas admission direction. The gas is suctioned off over a plurality of pump connections, for example four pump connections at the cover surface of the CVD reactor arranged opposite the floor. For example, the surface of the CVD reactor is cooled with water. The silicon surface is heated proceeding from its back side, for example by being irradiated with halogen lamps. Due to the symmetry of the CVD reactor, it is expedient to solve the equation system in cylindrical polar coordinates.

It has been shown that a uniform flow parallel to the silicon surface is established in such a CVD reactor. It is therefore adequate for many applications to solve the equation system only in a plane perpendicular to the silicon surface. Compared to the solution in the three-dimensional CVD reactor, considerable calculating time is thereby eliminated.

The equation system to be solved contains all critical, physical events in the form of partial differential equations. In particular, the transport of constituents having low concentration in the mixture of the process gases is thereby taken into consideration given pronounced temperature gradients. The diffusion of the process gases in the reactor, for example, is described by the following equation:

$$\frac{\partial \rho m_i}{\partial t} = div\left( \rho m_i v - \rho \sum_j D_{ij} \nabla m_j - D_i^T \nabla(\ln T) \right) + G_{ij}$$

where $\rho$ denotes the density in the medium, $m_i$ denotes the mass fraction of a particle i, t denotes the time, $\bar{v}$ denotes the velocity, $D_{ij}$ denotes the coefficient for multi-constituent diffusion $D^T_i$ denotes the coefficient for thermodiffusion, T denotes the temperature and $G_i$ denotes the generation rate of the particle i.

The production of undesired reaction products such as $WF_x$ and $SiF_x$ whose adsorption at the masking structure of $SiO_2$ and whose nucleation rate as a function of the local concentration are described by the following equations:

Formation and adsorption of WF $$j_{WFx} = k_1 \ominus [WF_6] - k_2 [WF_x]$$

where $j_{WFx}$ denotes the flow of $WF_x$, $k_1 = 10^{-5}$ kg/(ms), $\ominus$ denotes the portion of the surface that is covered with tungsten, $k_2 = 10^{-3}$ kg/(ms). $[WF_6]$ and $[WF_x]$ are the mass fractions of the particles $WF_6$ and $WF_x$, respectively.

The nucleation rate is described by $$n = (1 - \ominus) k_3 [WF_x]$$

n thereby denotes the nucleation rate per surface unit, $\ominus$ denotes the portion of the surface that is covered with tungsten, and $k_3 = 10^{13} s^{-1} m^{-2}$.

The chronological change of the portion 8 of the surface that is covered with tungsten is described by the following equation:

$$\frac{d\theta}{dt} = (1 - \theta) 2\pi R_w \int_o^t n(t')(t - t') R_w dt'$$

where $\ominus$ denotes the portion of the surface that is covered with tungsten, $R_w$ denotes the deposition rate of tungsten, t denotes the time, and n denotes the nucleation rate per surface unit.

The layer growth on the silicon surface is dependent on the transport of the chemical constituents to the reacting surfaces and on the speed of the chemical reaction itself. The deposition occurs on the basis of thermal reduction of tungsten hexafluoride and hydrogen in agreement with the reaction equation:

$$WF_6(g) + 3H_2(g) \rightarrow W(s) + 6HF(g).$$

The deposition rate $R_w$ of tungsten amounts to:

$R_w =$

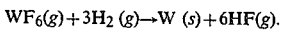

$$\left[ \left( \frac{1}{\rho_w} D_{WF6} \frac{N_{WF6}'}{\delta} \right)^{-1} + \left( k_o \exp \frac{-E_a}{kT} P_{H2}^{\frac{1}{2}} \right)^{-1} \right]^{-1}$$

where $\rho_W$ is the density of the CVD tungsten, $D_{WF6}$ is the diffusion coefficient of $WF_6$ in $H_2$ under the operating conditions $N'_{WF6}$ is the concentration of $WF_6$ at the location under consideration, $\delta$ is the distance of the location from the silicon surface, $P_{H2}$ is the pressure of the $H_2$, $k_0 = 4.08 \times 10^6$ (nm min$^{-1}$ Pa$^{-\frac{1}{2}}$), and Ea=0.75 eV is the activation energy.

The calculation is iteratively implemented. The values for the pressure at the gas discharge are thereby varied, for example, between 10 Pa and 150 Pa, the temperature at a substrate containing the silicon surface is varied between 300° and 450° and the flow-through rate of $WF_6$ is varied between 10 sccm/min and 50 sccm/min. 1000 sccm/min was thereby assumed for the flow-through rates of $H_2$. The set of parameters whereat the deposition rate of the tungsten achieves a prescribed value given a prescribed selectivity is used for the deposition.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for the selective deposition of tungsten on a silicon surface comprising the steps of:
   providing the silicon surface with a masking structure composed of $SiO_2$;
   implementing deposition of tungsten from a vapor phase in a chemical vapor deposition (CVD) reactor from a mixture of process gases containing $H_2$ and $WF_6$ such that the masking structure remains essentially free of tungsten; and
   calculating the process parameters of temperature, pressure and flow-through rates of the process gases for the selective deposition for a prescribed deposition rate by iteratively solving an equation system using different values of temperature, pressure and flow-through rates until a preselected value of the prescribed deposition rate of tungsten on the silicon surface is achieved, and using in the equation system conservation laws for mass, for chemical constituents participating in the deposition reaction, for momentum and for energy, and taking into consideration in the equation system boundary conditions of the CVD reactor and effects of thermodiffusion and multi-constituent diffusion, the equation system consisting of the following equations;

$$\frac{\partial \rho m_i}{\partial t} = div \left( \rho m_i v - \delta \sum_j D_{ij} \nabla m_j - D_i^T \nabla (\ln T) \right) + G_{ij}$$

$$j_{WFx} = k_1 \theta \{WF_6\} - k_2 \{WF_x\};$$

$$n = (1 - \theta) k_3 \{WF_x\};$$

$$\frac{d\theta}{dt} = (1 - \theta) 2\pi R_w \int_o^t n(t')(t - t') R_w dt';$$

$R_w =$ $$\left\{ \left( \frac{1}{\rho_w} D_{WF6} \frac{N_{WF6}'}{\delta} \right)^{-1} + \left( k_o \exp \frac{-E_a}{kT} P_{H2}^{\frac{1}{2}} \right)^{-1} \right\}^{-1}$$

where
$\rho$ is density in the medium,
$m_i$ is mass fraction of a particle i,
t is time,
v is velocity,
$D_{ij}$ is a coefficient for multi-constituent diffusion,
$D^T_i$ is a coefficient for thermodiffusion,
T is temperature,
$G_i$ is generation rate of the particle i,
$j_{WFx}$ is flow of $WF_x$,
$k_1 = 10^{-5}$ kg/(ms),
$\ominus$ is portion of the surface that is covered with tungsten,
$k_2 = 10^{-3}$ kg/(ms),
n is a nucleation rate per surface unit,
$k_3 = 10^{13} s^{-1} m^{-2}$,
$R_w$ is a deposition rate of tungsten,
$\rho_w$ is density of the CVD tungsten, $D_{WF_6}$ is a diffusion coefficient of $WF_6$ in $H_2$ under operating conditions, $N'_{WF_6}$ is a concentration of $WF_6$ at a location under consideration, $\delta$ is a distance of the location from the silicon surface, $P_{H2}$ is a pressure of $H_2$, $k_0 = 4.08 \times 10^6$ (nm min$^{-1}$ Pa$^{-\frac{1}{2}}$), $E_a$ is activation energy, $WF_6$ is a mass fraction of the particle $WF_{6, and}$ $WF_x$ is a mass fraction of the particle $WF_x$; and depositing tungsten on said silicon surface at the prescribed deposition rate using the process parameters of temperature, pressure and flow-through rates that were calculated by iteratively solving the equation system.

2. The method according to claim 1, wherein the process parameters are calculated using coordinates adapted to a symmetry of the CVD reactor.

3. The method according to claim 1, wherein the equation system is solved in only one plane perpendicular to the silicon surface.

* * * * *